United States Patent [19]

Akabane

[11] Patent Number: 5,198,778
[45] Date of Patent: Mar. 30, 1993

[54] METHOD FOR INSPECTING PRINTED CIRCUIT BOARDS WITH THROUGH-HOLES

[75] Inventor: Masao Akabane, Iruma, Japan

[73] Assignee: Nippon CMK Corp., Japan

[21] Appl. No.: 682,916

[22] Filed: Apr. 9, 1991

[30] Foreign Application Priority Data

Apr. 16, 1990 [JP] Japan .................................. 2-99859

[51] Int. Cl.$^5$ ...................... G01R 27/08; G01R 31/02
[52] U.S. Cl. ..................... 324/718; 324/715; 324/158 R; 324/537
[58] Field of Search ............... 324/713, 715, 716, 718, 324/719, 725, 537, 158 R, 158 P, 158 F

[56] References Cited

U.S. PATENT DOCUMENTS

| | | | |
|---|---|---|---|
| 3,766,470 | 10/1973 | Hay et al. | 324/716 |
| 3,781,683 | 12/1973 | Freed | 324/158 F |
| 4,675,600 | 6/1987 | Gergin | 324/158 P |

Primary Examiner—Jack B. Harvey
Attorney, Agent, or Firm—Bruce L. Adams; Van C. Wilks

[57] ABSTRACT

A method for inspecting a printed circuit board having through-holes filled with conductive paste and having a pair of current measurement lands and a pair of resistance measurement lands. The pairs of current measurement lands and resistance measurement lands are used to measure voltage and current through the through-holes using the four-probe method, thereby preventing incomplete inspection of printed circuit boards and improving the dependability of tests on the packing conditions of the conductive paste in the through-holes.

5 Claims, 2 Drawing Sheets

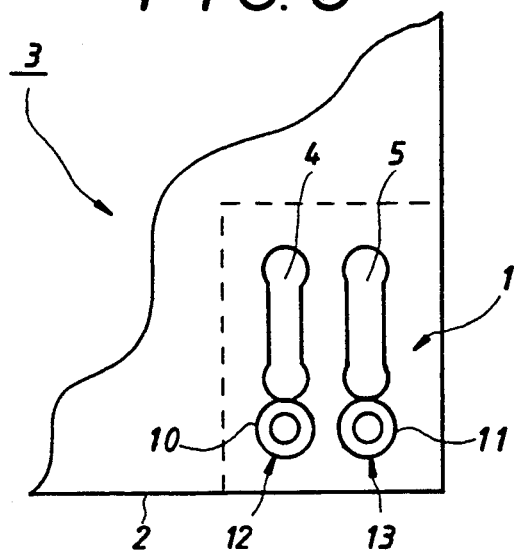
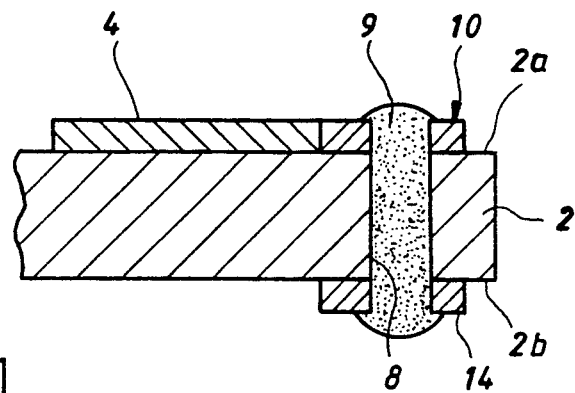
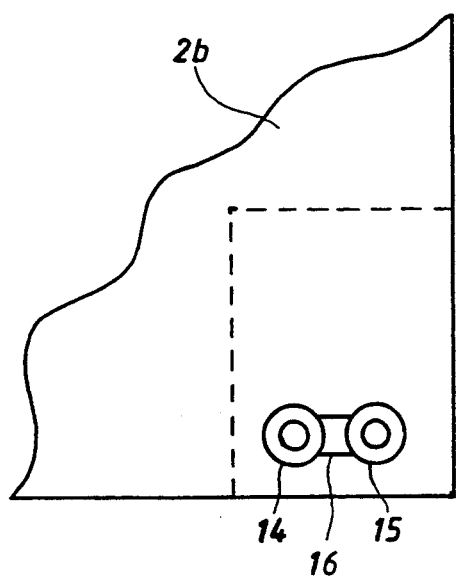

METHOD FOR INSPECTING PRINTED CIRCUIT BOARDS WITH THROUGH-HOLES

BACKGROUND OF THE INVENTION

The present invention relates to a method for inspecting printed circuit boards with through-holes. In the manufacture of conventional printed circuit boards with through-holes, after the through-holes are bored in the required positions, it is normal practice to pack conductive paste into the through-holes using a silk-screen printing method. Then, the packed conductive paste in each through-hole is visually inspected and current and voltage are measured between the top and bottom ends of the through-hole using the two-probe method on each printed circuit board or on circuit boards randomly selected from each lot.

In the above manufacturing process, it is difficult to use screen printing to spread conductive paste uniformly among all the through-holes of a printed circuit board or even in one printed circuit board, and the problem of incomplete packing thus arises. Unfortunately, the above-mentioned inspection and measurements are not always dependable and no other effective means for testing the packed conductive paste for electrical properties exists, thereby resulting in incomplete inspections. Therefore, an adequate testing means is desirable for conductive paste packed into through-holes on a printed circuit board.

SUMMARY OF THE INVENTION

The object of the present invention is to provide a method for inspecting a printed circuit board with through-holes filled with conductive paste. This method both prevents incomplete inspections and improves the dependability of tests on the packed conductive paste, thereby improving the product reliability of printed circuit boards.

According to the present invention, a method for inspecting a printed circuit board with through-holes filled with conductive paste between the two sides of the printed circuit board is provided. This inventive method employs the four-probe method to measure voltage and current through a pair of resistance measurement lands and a pair of current measurement lands for the through-holes located on one or both sides of the circuit board.

According to the above method for inspecting a printed circuit board with through-holes, it is possible to prevent incomplete inspection of a printed circuit board and to improve the dependability of tests on the packing conditions of conductive paste in the through-holes, using the four-probe method to measure the current and voltage of the through-holes.

Other objects, features, aspects, and advantages of the present invention will become more apparent from the following detailed description of the present invention and its accompanying drawings.

BRIEF DESCRIPTION OF THE DRAWINGS

FIG. 3 is a top plan view showing a test land of a printed circuit board as the second embodiment of the present invention;

FIG. 4 is a longitudinal sectional view showing the test land in the second embodiment; and FIG. 5 is a bottom plan view showing the test land in the second embodiment.

DETAILED DESCRIPTION OF THE INVENTION

First Embodiment

Figure 1:
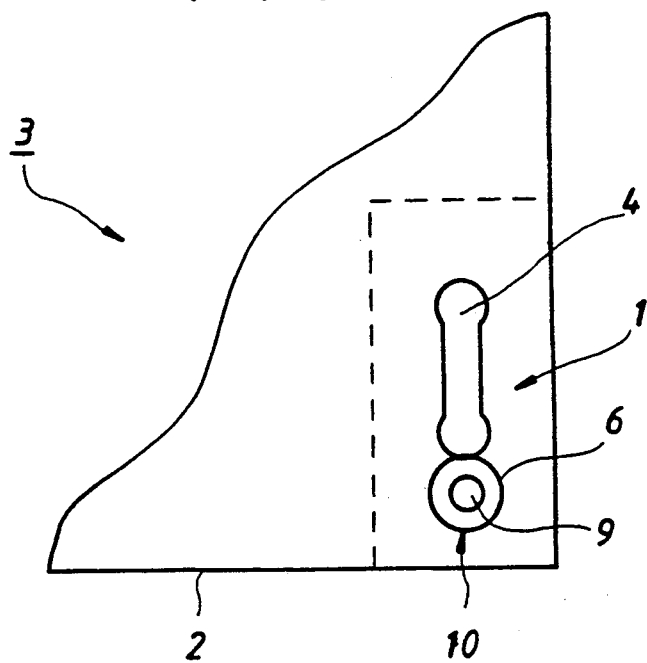
FIG. 1 is a top plan view showing a test land of a printed circuit board as the first embodiment of the present invention.
Figure 2:
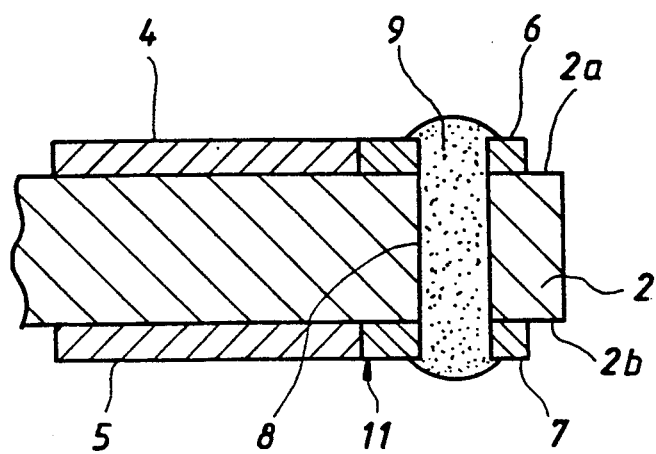
FIG. 2 is a longitudinal sectional view showing the test land in the first embodiment.

FIG. 1 is a top plan view showing a test land of a printed circuit board as the first embodiment of the present invention. FIG. 2 is a longitudinal sectional view showing the test land.

Referring to FIG. 1, the reference numeral 1 indicates a test land disposed in the required position on the printed circuit board (3) composed of a substrate (2) comprising the required circuit patterns (not shown) and through-holes (not shown).

Although FIG. 1 gives no concrete indication of the required position of the test land (1), the printed circuit board (3) may be constructed such that the test land (1) is removable from the circuit board as a product after the through-holes have been tested.

The test land (1), consisting of current measurement lands (4 and 5) and resistance measurement lands (10 and 11), is provided in the process of providing pattern circuits during the manufacture of the printed circuit board (3). After forming the current measurement lands (4 and 5) and through-hole lands (6 and 7) on the top and bottom faces (2a and 2b) of the substrate (2), a through-hole (8) is bored between the through-hole lands (6 and 7) by a process of boring (for example, punching) through-holes in the printed circuit board (3). After forming, the through-holes are packed in conductive paste (using for example, the silk-screen printing method). Thus, conductive paste (9) (for example, copper or silver paste) is packed into the through-hole (8), thereby forming the resistance measurement lands (10 and 11).

As described above, the test land (1), provided in the processes of forming circuit patterns and through-holes, consists of the current measurement lands (4 and 5) and the resistance measurement lands (10 and 11) in the printed circuit board (3).

Therefore, according to the present invention, during the manufacture of a printed circuit board having through-holes filled with conductive paste, a test land of the printed circuit board can be used to confirm the electrical conditions of the through-holes. In particular, in accordance with the present invention, current measurement lands and resistance measurement lands composing the test land can measure mΩ resistivity using the four-probe method, thereby improving the accuracy with which circuit boards are inspected.

Second Embodiment

FIG. 3 is a top plan view showing a test land of a printed circuit board as the second embodiment of the present invention. FIG. 4 is a longitudinal sectional view showing the test land. FIG. 5 is a bottom plan view showing the test land.

In the second embodiment, as in the first embodiment, the test land (1) is provided in the process of providing pattern circuits and through-holes during the manufacture of the printed circuit board (3). The test land (1) consists of current measurement lands (4 and 5), resistance measurement lands (10, 11, 14, and 15), and a jumper circuit (16).

The current measurement lands (4 and 5) are provided on the top face of a substrate (2), and through-holes (12 and 13) are provided in the substrate (2). The resistance measurement lands (10 and 11) are provided on the outer periphery of the through-holes (12 and 13), respectively, on the top face of the substrate (2), and the resistance measurement lands (14 and 15) are provided in positions corresponding to the resistance measurement lands (10 and 11), respectively, on the bottom face of the substrate (2) and are connected together by the jumper circuit (16).

It is clear from the above description that the current measurement lands (4 and 5) and the resistance measurement lands (10 and 11) of the test land (1) can be used to measure current and voltage.

Particularly, current measurement lands and resistance measurement lands composing the test land can measure mΩ resistivity using the four-probe method, thereby improving the accuracy with which circuit boards are inspected.

Therefore, in the second embodiment, in the same manner as in the first embodiment, during the manufacture of a printed circuit board with through-holes, the current measurement lands and resistance measurement lands in the test land of the printed circuit board can be used to test the through-holes for measuring current and voltage with the four-probe method, thereby improving the accuracy with which circuit boards are inspected.

Although in the above embodiments 1 and 2 the method for inspecting a printed circuit board requires inspection through a test land provided on the circuit board, the present invention is not limited to the use of a test land. but can also conduct measurements through a through-hole and a current measurement land (not shown in the drawings) provided on the circuit board.

I claim:

1. A method for inspecting a printed circuit board having through-holes filled with conductive paste between the two sides of the printed circuit board, comprising: providing at least one resistance measurement land on each side and at least one current measurement land on each side of said printed circuit board and forming at least one measurement through-hole adjacent thereto all in a predefined area of the printed circuit board, filling the at least one measurement through-hole with conductive paste during manufacture, and measuring voltage and current through the resistance measurement lands, the current measurement lands and the at least one measurement through-hole with a four-probe method.

2. A method for inspecting a printed circuit board having through-holes filled with conductive paste between the two opposed sides of the printed circuit board, comprising:
   forming a pair of resistance measurement lands on opposed sides of the printed circuit board and a pair of current measurement lands on one side or on both sides of the printed circuit board in a predefined measurement area, forming at least one measurement through-hole extending through the printed circuit board and through the opposed resistance measurement lands in the predefined measurement area of the printed circuit board, filling the at least one measurement through-hole with conductive paste to electrically connect the opposed resistance measurement lands during manufacture of the printed circuit board, and measuring voltage and current through the resistance measurement lands, the current measurement lands and the at least one measurement through-hole with a four-probe method.

3. A method according to claim 2, including removing the predefined measurement area from the circuit board after measuring voltage and current.

4. A method according to claim 2, including forming the current measurement lands and the resistance measurement lands on both sides of the printed circuit board.

5. A method for inspecting a printed circuit board having through-holes filled with conductive paste between the two opposed sides of the printed circuit board, comprising: forming two current measurement lands and two resistance measurement lands on one side of the printed circuit board in a predefined measurement area, forming two resistance measurement lands on the other side of the printed circuit board, forming two measurement through-holes extending through the printed circuit board and through respective pairs of resistance measurement lands disposed on opposed sides of the printed circuit board, filling the two measurement through-holes with conductive paste to electrically connect the opposed resistance measurement lands during manufacture of the printed circuit, forming a jumper on the other side of the printed circuit board to connect together the two resistance measurement lands disposed thereon, and measuring voltage and current through the resistance measurement lands, the current measurement lands and the two measurement through-holes with a four-probe method.

* * * * *